(12) United States Patent
Baek et al.

(10) Patent No.: US 10,511,286 B2
(45) Date of Patent: Dec. 17, 2019

(54) VARIABLE FREQUENCY FILTER

(71) Applicant: Samsung Electro-Mechanics Co., Ltd., Suwon-si (KR)

(72) Inventors: Won Jin Baek, Suwon-si (KR); Sung Tae Kim, Suwon-si (KR); Jung Woo Sung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 152 days.

(21) Appl. No.: 15/810,675

(22) Filed: Nov. 13, 2017

(65) Prior Publication Data

US 2018/0226947 A1     Aug. 9, 2018

(30) Foreign Application Priority Data

Feb. 3, 2017    (KR) .................. 10-2017-0015813
May 26, 2017   (KR) .................. 10-2017-0065524

(51) Int. Cl.
*H03H 9/56* (2006.01)
*H03H 9/54* (2006.01)
*H03H 9/205* (2006.01)
*H03H 9/60* (2006.01)

(52) U.S. Cl.
CPC ............ *H03H 9/568* (2013.01); *H03H 9/205* (2013.01); *H03H 9/542* (2013.01); *H03H 9/547* (2013.01); *H03H 9/605* (2013.01)

(58) Field of Classification Search
CPC ........ H03H 9/568; H03H 9/205; H03H 9/542; H03H 9/547; H03H 9/605

USPC ........................................................ 333/190
See application file for complete search history.

(56) References Cited

U.S. PATENT DOCUMENTS

| | | | |
|---|---|---|---|
| 6,262,637 B1 | 7/2001 | Bradley et al. | |
| 6,774,857 B2 | 8/2004 | Frank | |
| 7,863,699 B2 | 1/2011 | Dropmann et al. | |
| 2009/0251235 A1 | 10/2009 | Belot et al. | |
| 2015/0145610 A1 | 5/2015 | Ruby et al. | |
| 2016/0315653 A1 | 10/2016 | Saji et al. | |
| 2016/0344100 A1 | 11/2016 | Onaka et al. | |
| 2016/0352310 A1 | 12/2016 | Tani et al. | |
| 2017/0155376 A1 | 6/2017 | Yamaguchi | |
| 2018/0367118 A1* | 12/2018 | Jian ..................... | H03H 9/542 |

FOREIGN PATENT DOCUMENTS

KR     10-1224232 B1     1/2013

OTHER PUBLICATIONS

Bi et al., "Bulk Acoustic Wave RF Technology" published in IEEE microwave magazine, Oct. 2008, pp. 65-80 (Year: 2008).*
Brown et al., "Power MOSFET Basics: Understanding MOSFET Characteristics Associated With the Figure of Merit", Vishay Siliconix, Application Note, AN605, published on Sep. 8, 2003 (Year: 2003).*

(Continued)

*Primary Examiner* — Benny T Lee
*Assistant Examiner* — Hafizur Rahman
(74) *Attorney, Agent, or Firm* — NSIP Law

(57) ABSTRACT

A filter comprises a series unit, and a shunt unit disposed between the series unit and a ground. The shunt unit includes resonators that are selectively operated, and each of the shunt resonators includes a film bulk acoustic resonator.

20 Claims, 13 Drawing Sheets

(56) References Cited

OTHER PUBLICATIONS

United States Office Action dated Jan. 28, 2019 in related U.S. Appl. No. 15/808,970 (14 pages in English).
United States Office Action dated July 24, 2018, in related U.S. Appl. No. 15/816,149 (10 pages in English).
United States Office Action dated Aug. 8, 2019 in related application, U.S. Appl. No. 15/808,970 (16 pages in English).
Mahon et al., "BAW Flip-Chip Switched Filter Bank Delivers Dramatic Form Factor Reduction", *High Frequency Electronics*, Aug. 2008, pp. 24-28 (4 pages in English).
LTE Frequency band, http://niviuk.free.fr/lte_band.php, Released on Dec. 16, 2018 (5 pages in English).
Gao et al., "A Method Determining Order of BAW Ladder-Type Filter", *Proceedings of SPIE*, vol. 10799, SPIE Security + Defense, 2018. (8 pages in English).
United States Office Action dated May 16, 2019 in corresponding U.S. Appl. No. 15/802,627 (16 pages in English).

\* cited by examiner

| COMMUNICATIONS BAND | Tx[MHz] | Rx[MHz] |
|---|---|---|
| B1 | 1920 – 1980 | 2110 – 2170 |
| B2 | 1850 – 1910 | 1930 – 1990 |
| B3 | 1710 – 1785 | 1805 – 1880 |
| B4 | 1710 – 1755 | 2110 – 2155 |
| B5 | 824 – 849 | 869 – 894 |
| B6 | 830 – 840 | 875 – 885 |
| B7 | 2500 – 2570 | 2620 – 2690 |
| B8 | 880 – 915 | 925 – 960 |
| B9 | 1749.9 – 1784.9 | 1844.9 – 1879.9 |
| B10 | 1710 – 1770 | 2110 – 2170 |
| B11 | 1427.9 – 1452.9 | 1475.9 – 1500.9 |
| B12 | 698 – 716 | 728 – 746 |
| B13 | 777 – 787 | 746 – 756 |
| B14 | 788 – 798 | 758 – 768 |
| B15 | 1900 – 1920 | 2600 – 2620 |
| B16 | 2010 – 2025 | 2585 – 2600 |
| B17 | 704 – 716 | 734 – 746 |
| B18 | 815 – 830 | 860 – 875 |
| B19 | 830 – 845 | 875 – 890 |
| B20 | 832 – 862 | 791 – 821 |
| B21 | 1447.9 – 1462.9 | 1495.5 – 1510.9 |
| B22 | 3410 – 3500 | 3510 – 3600 |
| B23 | 2000 – 2020 | 2180 – 2200 |
| B24 | 1625.5 – 1660.5 | 1525 – 1559 |
| B25 | 1850 – 1915 | 1930 – 1995 |
| B65 | 1920 – 2010 | 2110 – 2200 |
| B66 | 1710 – 1780 | 2110 – 2200 |

FIG. 1A

VARIABLE FREQUENCY FILTER

CROSS-REFERENCE TO RELATED APPLICATION(S)

This application claims benefit under 35 USC 119(a) of Korean Patent Application Nos. 10-2017-0015813 filed on Feb. 3, 2017 and 10-2017-0065524 filed on May 26, 2017 in the Korean Intellectual Property Office, the entire disclosure of which is incorporated herein by reference for all purposes.

BACKGROUND

1. Field

The present disclosure relates to a filter.

2. Description of Related Art

In accordance with the rapid development of mobile communications devices, chemical and biological devices, demand for small and light, filters, oscillators, resonant elements, acoustic resonant mass sensors, and the like, used in such devices, has also increased.

A film bulk acoustic resonator (FBAR) has been used as an element for implementing such small and light, filters, oscillators, resonant elements, acoustic resonant mass sensors. Such FBAR may be mass-produced at a minimal cost to have subminiature size. In addition, the FBAR may have a high quality factor (Q) value, a main characteristic of a filter. The FBAR may be used in a microwave frequency band that allows for use of particular bands of personal communications systems (PCS) and digital cordless systems (DCS).

Recently, as wireless terminals have been implemented with the ability to support communications within a plurality of bands, a plurality of filters controlling the plurality of bands have been used in the wireless terminals. However, when the number of filters controlling the plurality of bands increases in correspondence with the an increase in the number of bands, signal processing processes become complicated, while manufacturing costs and the size of the filters module may increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes a series unit and a shunt unit disposed between the series unit and a ground. The shunt unit includes shunt resonators that are selectively operated, and each of the shunt resonators includes a film bulk acoustic resonator.

The shunt unit may include a first shunt resonator and a second shunt resonator having different anti-resonant frequencies each from the other.

A frequency band of the filter may be varied based on a selective operation of the first shunt resonator and the second shunt resonator.

A lower limit frequency of the frequency band may be varied based on the selective operation of the first shunt resonator and the second shunt resonator.

An anti-resonant frequency of the first shunt resonator may be higher than that of the second shunt resonator, and in one selectively operated state, the frequency band of the first shunt resonator may be narrower than that of the second shunt resonator.

The first shunt resonator and the second shunt resonator may be connected to each other in parallel.

The shunt unit further include a first switch connected to the first shunt resonator in series; and a second switch connected to the second shunt resonator in series.

The first shunt resonator and the second shunt resonator may be selectively operated based on switching operations of the first switch and the second switch.

The first shunt resonator, the second shunt resonator, the first switch, and the second switch may be formed in a single chip.

In another general aspect, a filter includes a series unit; and a shunt unit disposed between the series unit and a ground. The shunt unit includes a shunt resonator and a transistor disposed between the shunt resonator and a ground. A frequency band of the filter is varied based on turning-on and turning-off operations of the transistor.

In a turned-on operating state, the transistor may be equivalent to a resistor, and in a turned-off operating state, the transistor may be equivalent to a capacitor.

An anti-resonant frequency of the shunt unit may be varied based on the turning-on and turning-off operations of the transistor.

A lower limit frequency of the frequency band may be varied based on the variation in the anti-resonant frequency of the shunt unit.

The anti-resonant frequency of the shunt unit during the turning-off operation of the transistor may be higher than that of the shunt unit during the turning-on operation of the transistor.

The frequency band during the turning-off operation of the transistor may be narrower than that during the turning-on operation of the transistor.

Other features and aspects will be apparent from the following detailed description, the drawings, and the claims.

BRIEF DESCRIPTION OF DRAWINGS

FIG. 1A is an example of a table that illustrates frequencies of transmit bands and receive bands of communications bands.

DETAILED DESCRIPTION

Figure 1B:
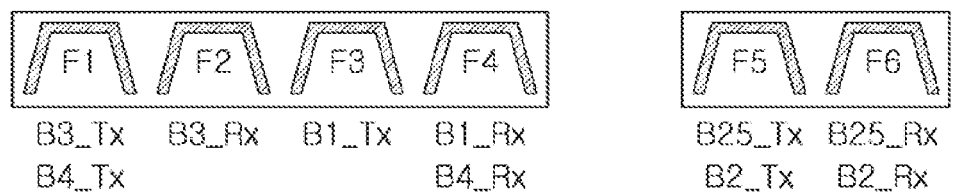
FIG. 1B illustrates an example of a filter module and communications bands supported by the filter module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1A is an example of a table provided to illustrate frequencies of transmit bands and receive bands of communications bands. FIG. 1B illustrates an example of a filter module and communications bands supported by the filter module.

Communications bands illustrated in FIG. 1A is that of long term evolution (LTE) communications bands, and communications bands B1 to B25, B65, and B66 include transmit bands Tx known as an uplink band and receive bands Rx known as a downlink band.

Referring to FIG. 1B, the filter module includes a plurality of filters, which control transmit bands and receive bands of communications bands supported by the filter module.

When the filter module supports the communications bands B1, B2, B3, B4, and B25, the plurality of filters controls communications bands B1_Tx, B1_Rx, B2_Tx, B2_Rx, B3_Tx, B3_Rx, B4_Tx, B4_Rx, B25_Tx, and B25_Rx in order to transmit and receive radio frequency signals.

When the plurality of filters includes six filters F1 to F6 and used to control 10 transmit and received bands, some of the six filters F1 to F6 are used to control two bands of partially overlapping bandwidths.

Referring to FIG. 1B, the filter F1 controls the communications bands B3_Tx and B4_Tx, the filter F 2 controls the communications band B3_Rx, the filter F3 controls the communications band B1_Tx, and the filter F4 controls the communications bands B1_Rx and B4_Rx. In addition, the filter F5 controls the communications bands B2_Tx and B25_Tx, and the filter F6 controls the communications bands B2_Rx and B25_Rx. As an example, the filters F1, F2, F3, and F4 may constitute a quadplexer, and the filters F5 and F6 may constitute a duplexer.

The filter module of FIG. 1B supports a larger number of communications bands than that of filters included in the filter module. However, one filter module needs to control a larger number of communications bands in order to decrease the size and space occupied by the filter module in a miniaturized wireless terminal.

Figure 2:
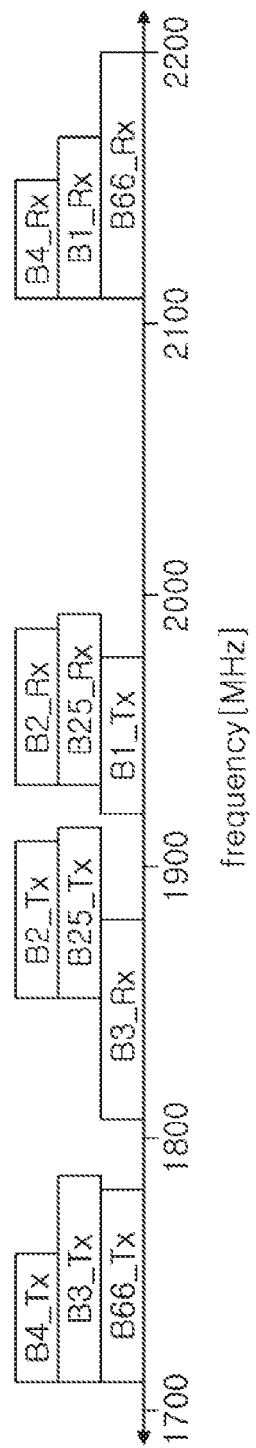
FIG. 2 illustrates communications bands supported by an example of a filter module in the present disclosure.

FIG. 2 illustrates an example of communications bands supported by the filter module in the present disclosure.

Referring to FIG. 2, when the filter module supports the communications bands B1, B2, B3, B4, B25, and B66, a plurality of filters used in the filter module may control communications bands B1_Tx, B1_Rx, B2_Tx, B2_Rx, B3_Tx, B3_Rx, B4_Tx, B4_Rx, B25_Tx, B25_Rx, B66_Tx, and B66_Rx.

Referring to FIGS. 1A and 2, bandwidths of the communications bands B3_Tx, B4_Tx, and B66_Tx partially overlap one another; bandwidths of the communications bands B3_Rx, B25_Tx, and B2_Tx partially overlap one another; bandwidths of the communications bands B1_Tx, B25_Rx, and B2_Rx partially overlap one another; and bandwidths of the communications bands B1_Rx, B4_Rx, and B66_Rx partially overlap one another.

The filter module according to an example in the present disclosure includes a plurality of filters, and at least one filter controls bands having overlapping bandwidths, such that the size and manufacturing costs of the filter module is reduced.

Figure 3:
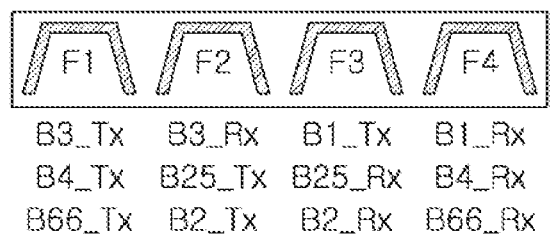
FIG. 3 illustrates an example of the filter module.

FIG. 3 is a view provided to illustrate the filter module according to an example in the present disclosure.

According to an example in the present disclosure, at least one of a plurality of filters used in the filter module controls at least two communications bands of which bandwidths partially overlap one another.

Referring to FIGS. 1A and 3, the filter module include a plurality of filters F1, F2, F3, and F4. The plurality of filters F1, F2, F3, and F4 may constitute one of a quadplexer and a duplexer.

When the filter module includes four filters F1, F2, F3, and F4, the filter F1 controls the communications bands B3_Tx, B4_Tx, and B66_Tx of which bandwidths partially overlap one another. The filter F2 controls partially overlapping bandwidths of the communications band B3_Rx, B25_Tx, and B2_Tx. The filter F3 controls partially overlapping bandwidths of the communications band B1_Tx, B25_Rx, and B2_Rx. The filter F4 controls partially overlapping bandwidths of the communications bands B1_Rx, B4_Rx, and B66_Rx. When the four filters F1 to F4 control the bands of which the bandwidths overlap one another as illustrated in FIG. 3, the number of filters that control the bands may be decreased.

According to an example in the present disclosure, at least two communications bands that at least one filter of the filter module controls have different upper limit frequencies and lower limit frequencies. As an example, the filter F2 controls the communications band B3_Rx having a lower limit frequency of 1805 MHz and an upper limit frequency of 1880 MHz; the communications band B2_Tx having a lower limit frequency of 1850 MHz and an upper limit frequency of 1910 MHz; and the communications band B25_Tx having a lower limit frequency of 1850 MHz and an upper limit frequency of 1915 MHz. In addition, the filter F3 control the communications band B1_Tx having a lower limit frequency of 1920 MHz and an upper limit frequency of 1980 MHz; the communications band B2_Rx having a lower limit frequency of 1930 MHz and an upper limit frequency of 1990 MHz; and the communications band B25_Rx having a lower limit frequency of 1930 MHz and an upper limit frequency of 1995 MHz.

Referring to FIGS. 1A, 2, and 3, an interval between a frequency band of 1805 MHz to 1915 MHz supported by the filter F2 and a frequency band of 1920 MHz to 1995 MHz supported by the filter F3 are relatively narrow (approximately 5 MHz). Therefore, when the filter F2 and the filter F3 use frequency bands allocated thereto as they are, there is a risk that interference will be generated in radio frequency signals transmitted to and received by the filter F2 and the filter F3.

In the filter module according to an example in the present disclosure, when frequency bands of different filters supporting adjacent frequency bands have a difference of 1 MHz to 10 MHz therebetween, the frequency bands of the different filters are varied, depending on a mode, to prevent generation of interference in radio frequency signals transmitted to and received by the filters.

As an example, the filter F2 adjusts an upper limit frequency within a range of 1880 MHz to 1915 MHz to vary its allocated frequency band, and the filter F3 adjust a lower limit frequency within a range of 1920 MHz to 1930 MHz to vary its allocated frequency band.

Figure 4:
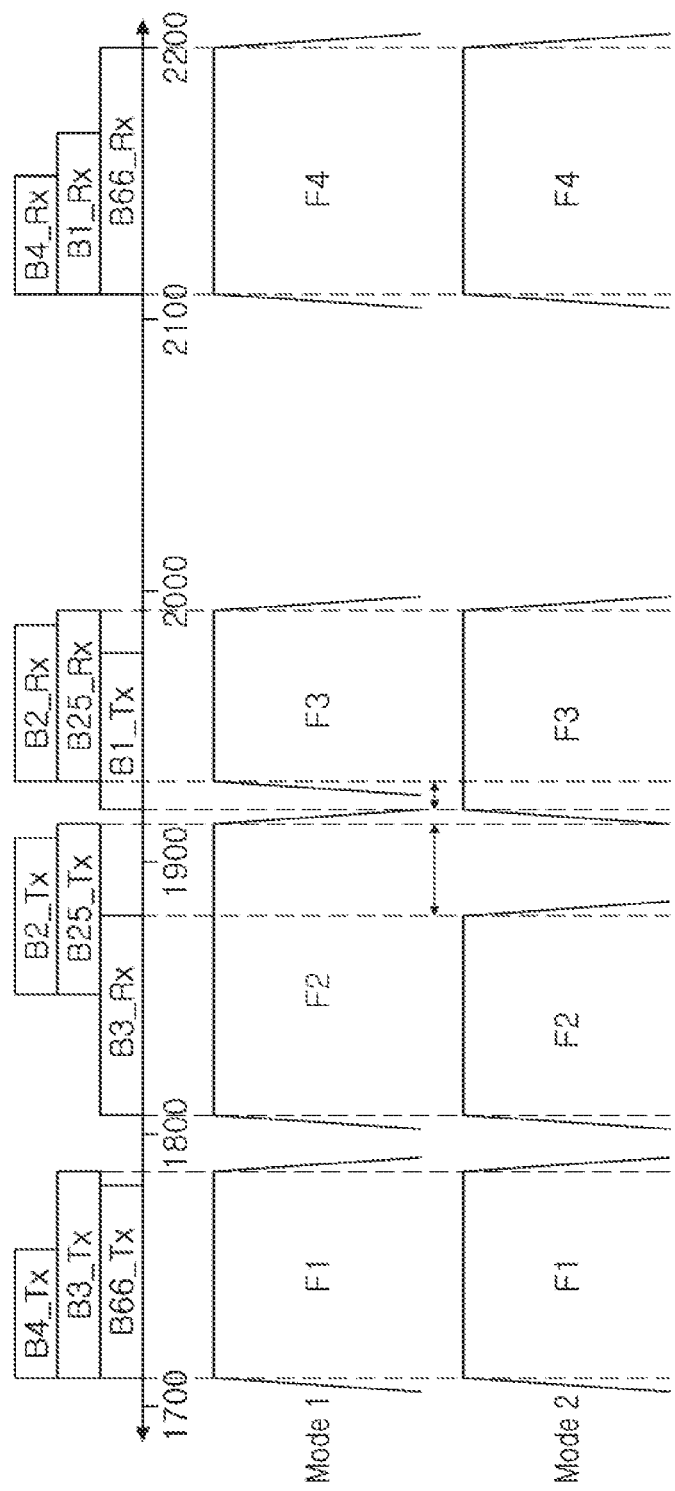
FIG. 4 illustrates an example of modes of the filter module.

FIG. 4 is a view provided to illustrate different modes of the filter module according to an example in the present disclosure.

Referring to FIG. 4, the filter module is operated in a first mode and a second mode. Bandwidths allocated to the filter F1 and the filter F4 is fixed, and bandwidths allocated to the filter F2 and the filter F3 may be adjusted in order to avoid interference of frequency signals, regardless of mode. As an example, the upper limit frequency of the filter F2 is changed to adjust the bandwidth of the filter F2, and the lower limit frequency of the filter F3 is changed to adjust the bandwidth of the filter F3. Here, when the upper limit frequency of the filter F2 is increased, such that the bandwidth of the filter F2 is increased, the lower limit frequency of the filter F3 is increased, such that the bandwidth of the filter F3 is decreased. In addition, when the upper limit frequency of the filter F2 is decreased, such that the bandwidth of the filter F2 is decreased, the lower limit frequency of the filter F3 is decreased, such that the bandwidth of the filter F3 is increased.

In detail, the upper limit frequency of the filter F2 is increased so that the filter F2 controls the communications bands B3_Rx, B_25Tx, and B2_Tx in the first mode Mode 1, such that the bandwidth of the filter F2 is increased. The upper limit frequency of the filter F2 is decreased so that the filter F2 controls the communications band B3_Rx in the second mode Mode 2, such that the bandwidth of the filter F2 is decreased.

In addition, the lower limit frequency of the filter F3 is increased so that the filter F3 controls the communications bands B_25Rx, and B2_Rx in the first mode Mode 1, such that the bandwidth of the filter F3 is decreased. The lower limit frequency of the filter F3 is decreased so that the filter F3 controls the communications bands B1_Tx, B_25Rx, and B2_Rx in the second mode Mode 2, such that the bandwidth of the filter F3 is decreased.

Figure 5:
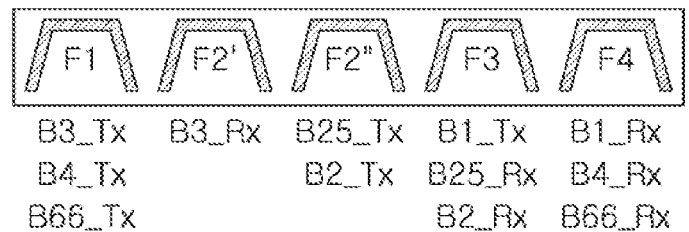
FIG. 5 illustrates another example of a filter module.

FIG. 5 is a view provided to illustrate the filter module according to another example in the present disclosure. Since the filter module of FIG. 5 is similar to the filter module of FIG. 3, descriptions of the same or overlapping contents will be omitted, and contents different from the contents of the filter module of FIG. 3 will be mainly described.

Referring to FIG. 5, the filter module includes a plurality of filters F1, F2', F2", F3, and F4. The plurality of filters F1, F2', F2", F3, and F4 may constitute one of a quadplexer and a duplexer. When the filter module includes five filters F1, F2', F2", F3, and F4, the filter F1 controls the communications bands B3_Tx, B4_Tx, and B66_Tx; the filter F2' controls the communications band B3_Rx; the filter F2" controls the communications bands B25_Tx and B2_Tx; the filter F3 controls the communications bands B1_Tx, B25_Rx, and B2_Rx; and the filter F4 may control the communications bands B1_Rx, B4_Rx, and B66_Rx.

Comparing FIGS. 3 and 5 with each other, the filter that controls the communications bands B3_Rx, B25_Tx, and B2_Tx is divided into two filters in the filter module of FIG. 5, such that the filters F2' and F2" are easily manufactured. Here, the filters F2' and F2" are operated in different modes, such that interference between frequency bands supported by the filters F2' and F2" is avoided.

Figure 6:
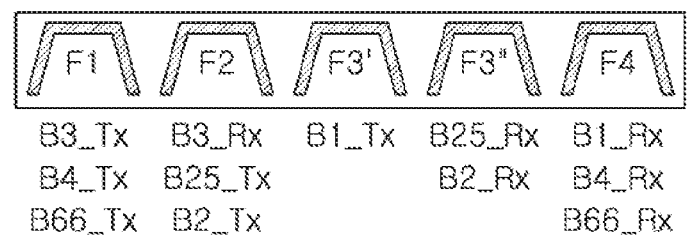
FIG. 6 illustrates another example of a filter module.

FIG. 6 is a view provided to illustrate the filter module according to another example in the present disclosure. Since the filter module of FIG. 6 is similar to the filter module of FIG. 3, descriptions of the same or overlapping contents will be omitted, and contents different from the contents of the filter module of FIG. 3 will be mainly described.

Referring to FIG. 6, the filter module includes a plurality of filters F1, F2, F3', F3", and F4. The plurality of filters F1, F2, F3', F3", and F4 may constitute one of a quadplexer and a duplexer. When the filter module includes five filters F1, F2, F3', F3", and F4, the filter F1 controls the communications bands B3_Tx, B4_Tx, and B66_Tx; the filter F2 controls the communications bands B3_Rx, B25_Tx and B2_Tx; the filter F3' controls the communications band B1_Tx; the filter F3" controls the communications bands B25_Rx and B2_Rx; and the filter F4 controls the communications bands B1_Rx, B4_Rx, and B66_Rx.

Comparing FIGS. 3 and 6 with each other, the filter that controls the communications bands B1_Tx, B25_Rx, and B2_Rx is divided into two filters in the filter module of FIG. 6, such that the filters F3' and F3" are easily manufactured. Here, the filters F3' and F3" are operated in different modes, such that interference between frequency bands supported by the filters F3' and F3" is avoided.

Figure 7:
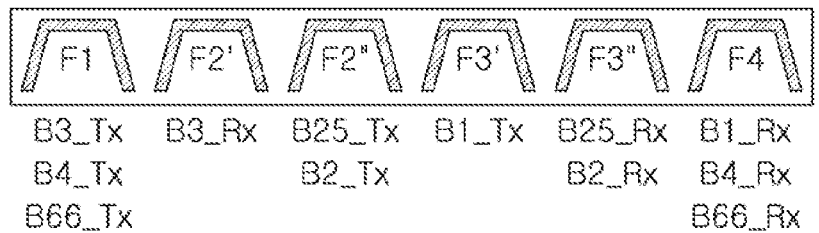
FIG. 7 illustrates another example of a filter module.

FIG. 7 is a view provided to illustrate a filter module according to another example in the present disclosure. Since the filter module of FIG. 7 is similar to the filter module of FIG. 3, descriptions of the same or overlapping contents will be omitted, and contents different from the contents of the filter module of FIG. 3 will be mainly described.

Referring to FIG. 7, the filter module includes a plurality of filters F1, F2', F2", F3', F3", and F4. The plurality of filters F1, F2', F2", F3', F3", and F4 may constitute one of a quadplexer and a duplexer. When the filter module includes six filters F1, F2', F2", F3', F3", and F4, the filter F1 controls the communications bands B3_Tx, B4_Tx, and B66_Tx; the filter F2' controls the communications band B3_Rx; the filter F2" controls the communications bands B25_Tx and B2_Tx; the filter F3' controls the communications band B1Tx; the filter F3" controls the communications bands B25_Rx and B2_Rx; and the filter F4 controls the communications bands B1_Rx, B4_Rx, and B66_Rx.

Comparing FIGS. 3 and 7 with each other, the filter that controls the communications bands B3_Rx, B25_Tx, and B2_Tx is divided into two filters in the filter module of FIG. 7, such that the filters F2' and F2" are easily manufactured. The filter that controls the communications bands B1_Tx, B25_Rx, and B2_Rx is divided into two filters in the filter module of FIG. 7, such that the filters F3' and F3" are easily manufactured.

The filters F2' and F2" are operated in different modes, such that interference between frequency bands supported by the filters F2' and F2" is avoided. The filters F3' and F3" are operated in different modes, such that interference between frequency bands supported by the filters F3' and F3" is avoided.

Figure 8A:
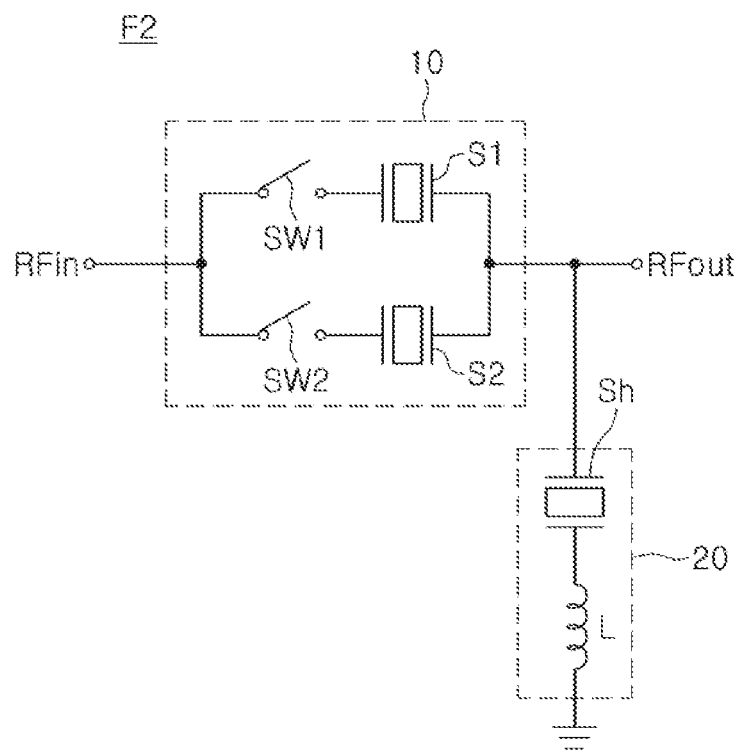
FIGS. 8A and 8B illustrate examples of a manner of changing an upper limit frequency of the example in FIG. 3.
Figure 8B:
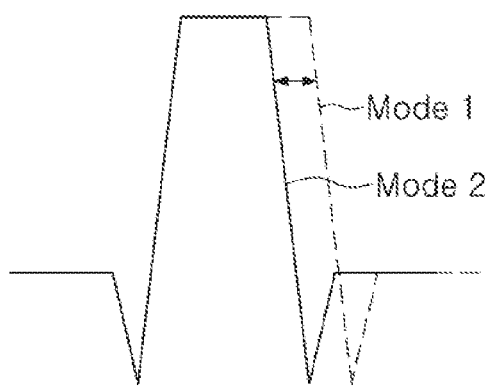

FIGS. 8A and 8B are views provided to illustrate a manner of changing the upper limit frequency according to the example of FIG. 3. FIG. 8A is a circuit diagram illustrating the filter F2 of FIG. 3, and FIG. 8B is graphs illustrating a change in a frequency band of the filter F2.

Referring to FIG. 8A, the filter F2 according to an example in the present disclosure includes a plurality of resonators. Here, each of the plurality of resonators may include a film bulk acoustic resonator (FBAR).

The filter F2 includes at least one series unit 10 and at least one shunt unit 20 disposed between at least one series unit 10 and a ground. The filter F2 is formed in a ladder type filter structure as illustrated in FIG. 8A, or may be formed in a lattice type filter structure.

At least one series unit 10 is disposed between a signal input terminal RFin to which an input signal is input and a signal output terminal RFout from which an output signal is output. At least one shunt unit 20 is disposed between a connection node between the series unit 10 and the signal output terminal RFout and a ground, or between a connection node between the series unit 10 and the signal input terminal RFin and a ground.

As used here, a series unit means a collection of components that comprise any one or any combination or any two or more of a switch, a series resonator, and a transistor. A shunt unit means a collection of components that comprise any one or any combination or any two or more of a switch, a shunt resonator, an inductor, and a transistor.

A case in which the filter F2 includes one series unit 10 and one shunt unit 20 is illustrated in FIG. 8A, but may also be a plurality of series units 10 and shunt units 20. When the filter F2 includes a plurality of series units 10 and a plurality of shunt units 20, the plurality of series units 10 are connected to each other in series, and the shunt units 20 are disposed between a node between the series units 10 connected to each other in series and the ground. The shunt unit 20 include at least one shunt resonator Sh, and may further include a trimming inductor disposed between the shunt resonator Sh and the ground.

At least one series unit 10 includes a first series resonator S1 and a second series resonator S2. The first series resonator S1 and the second series resonator S2 may be selectively operated. The first series resonator S1 and the second series resonator S2 are connected to each other in parallel through a first switch SW1 and a second switch SW2. In detail, the first series resonator S1 and the first switch SW1 are connected to each other in series, and the second series resonator S2 and the second switch SW2 are connected to each other in series. The first series resonator S1 and the first switch SW1 connected to each other in series and the second series resonator S2 and the second switch SW2 connected to each other in series may be connected to each other in parallel. The first series resonator S1, the second series resonator S2, the first switch SW1, and the second switch SW2 may be manufactured as a single chip.

The first switch SW1 and the second switch SW2 may be switched in different modes. As an example, in the first mode Mode 1, the first switch SW1 is turned on and the second switch SW2 is turned off. In the second mode Mode 2, the first switch SW1 is turned off and the second switch SW2 is turned on.

The first series resonator S1 and the second series resonator S2 have different resonant frequencies and anti-resonant frequencies. As an example, a resonant frequency of the first series resonator S1 operated in the first mode Mode 1 is higher than that of the second series resonator S2. Therefore, referring to FIG. 8B, in the first mode Mode 1, an upper limit frequency of the filter F2 is increased by the first series resonator S1, such that a bandwidth of the filter F2 is increased, and in the second mode Mode 2, the upper limit frequency of the filter F2 is decreased by the second series resonator S2, such that the bandwidth of the filter F2 is decreased.

Figure 9A:
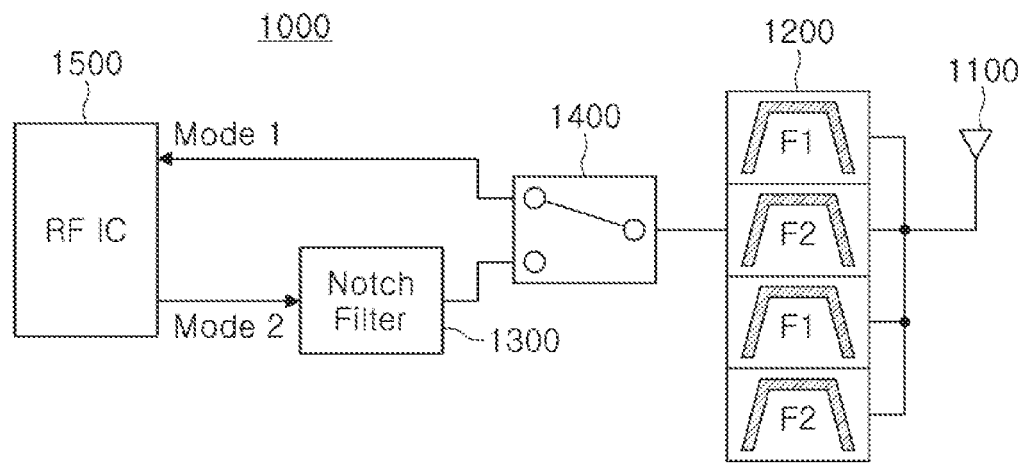
FIGS. 9A through 9C illustrate another set of examples of a manner of changing an upper limit frequency of the example in FIG. 3.
Figure 9B:
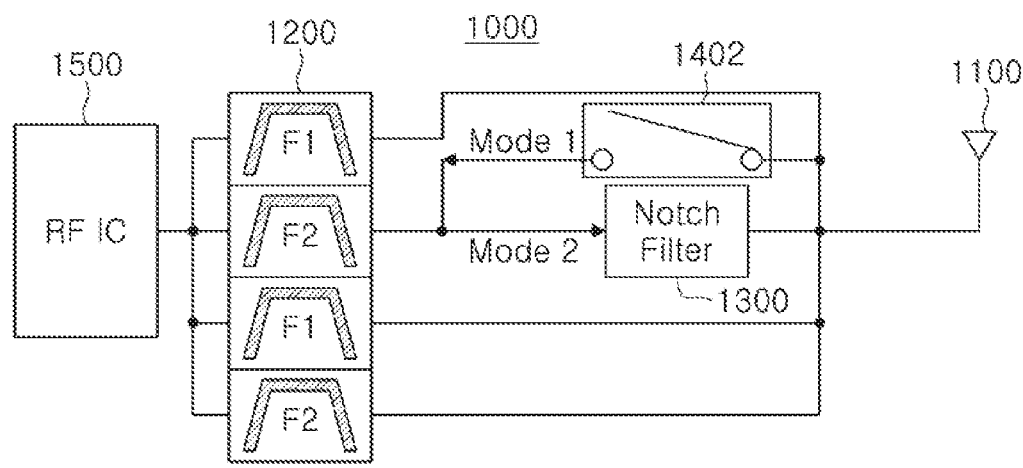
Figure 9C:
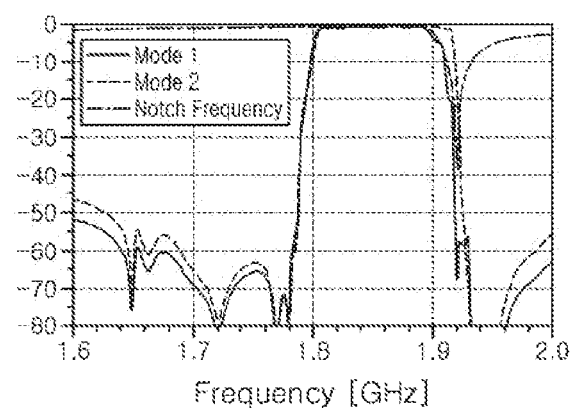

FIGS. 9A through 9C are illustrate another set of examples of a manner of changing an upper limit frequency of the example in FIG. 3.

FIGS. 9A and 9B are circuit diagrams illustrating a front end module according to the present example, and FIG. 9C illustrate graphs of changes in a frequency band of a filter F2 according to the present example.

Referring to FIGS. 9A and 9B, the front end module 1000 according to the present example includes an antenna 1100, a filter module 1200, a notch filter 1300, a switch 1400, and a radio frequency (RF) integrated circuit (IC) 1500. A plurality of filters F1, F2, F3, and F4 of the filter module 1200 correspond to those of the filter module of FIG. 3. The plurality of filters F1, F2, F3, and F4 of the filter module 1200 and the notch filter 1300 are manufactured using film bulk acoustic resonators (FBARs). In this case, the filter module 1200, the notch filter 1300, and the switch 1400 may be manufactured as a single chip.

The antenna 1100 transmits and receives RF signals. The filter module 1200 performs a filter operation for passing or removing frequency components in a specific frequency band in the RF signals received through the antenna 1100 or RF signals transmitted and received through the RF IC 1500. The filter module 1200 corresponds to the filter module of FIG. 3, and includes the plurality of filters F1, F2, F3, and F4.

The filter F2 of the filter module 1200 is selectively connected to the notch filter 1300 based on the mode. Therefore, the notch filter 1300 is selectively operated. The notch filter 1300 is disposed between the filter module 1200 and the RF IC 1500 or may be disposed between the filter module 1200 and the antenna 1100, and may be selectively connected to the filter F2 depending on the mode.

Referring to FIG. 9A, the notch filter 1300 and the switch 1400 connected to each other in series are disposed between the filter module 1200 and the RF IC 1500. The switch 1400 is a three-terminal switch of which a first terminal is connected to the filter module 1200, a second terminal is connected to the RF IC 1500, and a third terminal is connected to the notch filter 1300. The first terminal of the switch 1400 is connected to one of the second terminal and the third terminal of the switch 1400 to connect the filter module 1200 and the RF IC 1500 to each other or connect the filter module 1200 and the notch filter 1300 to each other.

The switch 1400 directly connects the filter F2 of the filter module 1200 and the RF IC 1500 to each other in the first mode, and connects the filter F2 of the filter module 1200 and the RF IC 1500 to each other through the notch filter 1300 in the second mode.

Referring to FIG. 9B, the notch filter 1300 and the switch 1402 connected to each other in parallel are disposed between the filter module 1200 and the antenna 1100. The switch 1402 is turned on in the first mode to directly connect the filter F2 of the filter module 1200 and the antenna 1100 to each other, and turned off in the second mode, such that the filter F2 of the filter module 1200 is connected to the antenna 1100 through the notch filter 1300.

Referring to FIG. 9C, when a path of RF signals through the notch filter 1300 that depends on a switching operation of the switch 1400 in the first mode Mode 1 is not formed, a frequency band is formed that depends on a unique upper limit frequency and lower limit frequency of the filter F2. However, when a path of RF signals through the notch filter 1300 that depends on a switching operation of the switch 1400 in the second mode Mode 2 is formed, an upper limit frequency of the filter F2 is decreased by frequency characteristics of the notch filter 1300, such that a bandwidth of the filter F2 is decreased.

Figure 10A:
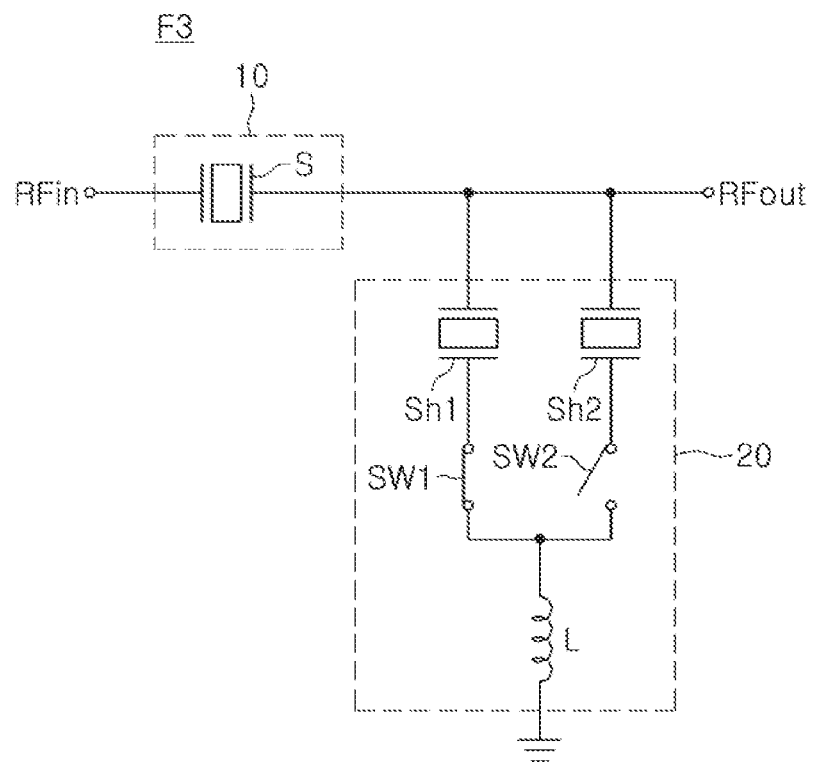
FIGS. 10A and 10B illustrate an example of a manner of changing a lower limit frequency of FIG. 3.
Figure 10B:
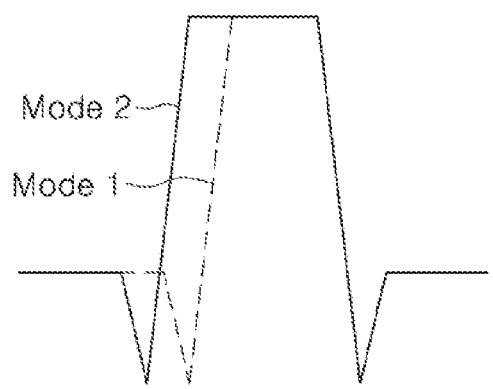

FIGS. 10A and 10B illustrate an example of a manner of changing a lower limit frequency of FIG. 3. FIG. 10A is a circuit diagram illustrating the filter F3 of FIG. 3, and FIG. 10B illustrate graphs of a change in a frequency band of the filter F3.

Referring to FIG. 10A, the filter F3 according to an example in the present disclosure includes a plurality of resonators. Here, each of the plurality of resonators may include a film bulk acoustic resonator (FBAR).

The filter F3 includes at least one series unit 10 and at least one shunt unit 20 disposed between the series unit 10 and a ground. The filter F3 is formed in a ladder type filter structure as illustrated in FIG. 10A, or may be formed in a lattice type filter structure.

At least one series unit 10 is disposed between a signal input terminal RFin to which an input signal is input and a signal output terminal RFout from which an output signal is output, and at least one shunt unit 20 may be disposed between a connection node between at least one series unit 10 and the signal output terminal RFout and a ground or between a connection node between at least one series unit 10 and the signal input terminal RFin and a ground.

A case in which the filter F3 includes one series unit 10 and one shunt unit 20 is illustrated in FIG. 10A, but a plurality of series units 10 and shunt units 20 may also be used. When the filter F3 includes a plurality of series units 10 and a plurality of shunt units 20, the plurality of series units 10 may be connected to each other in series, and the shunt units 20 may be disposed between a node between the series units 10 connected to each other in series and the ground. The series unit 10 includes at least one series resonator S.

At least one shunt unit 20 includes a first shunt resonator Sh1 and a second shunt resonator Sh2. The first shunt resonator Sh1 and the second shunt resonator Sh2 are selectively operated.

The first shunt resonator Sh1 and the second shunt resonator Sh2 are connected to each other in parallel through a first switch SW1 and a second switch SW2. In detail, the first shunt resonator Sh1 and the first switch SW1 are connected to each other in series, and the second shunt resonator Sh2 and the second switch SW2 are connected to each other in series. However, the first shunt resonator Sh1 and the first switch SW1 connected to each other in series, and the second shunt resonator Sh2 and the second switch SW2 connected to each other in series may be connected to each other in parallel. The first shunt resonator Sh1 and the second shunt resonator Sh2 connected to each other in parallel are connected to a ground through a trimming inductor L. A case in which the first shunt resonator Sh1 and the second shunt resonator Sh2 are connected to the ground through one trimming inductor L is illustrated in FIG. 10A, but the first shunt resonator Sh1 and the second shunt resonator Sh2 may also be connected to the ground through separate trimming inductors L.

The first switch SW1 and the second switch SW2 are switched in different modes. As an example, in the first mode Mode 1, the first switch SW1 is turned on and the second switch SW2 is turned off. In the second mode Mode 2, the first switch SW1 is turned off and the second switch SW2 is turned on.

The first shunt resonator Sh1 and the second shunt resonator Sh2 may have different resonant frequencies and anti-resonant frequencies. As an example, an anti-resonant frequency of the first shunt resonator Sh1 operated in the first mode Mode 1 is higher than that of the second shunt resonator Sh2.

Therefore, referring to FIG. 10B, in the first mode Mode 1, a lower limit frequency of the filter F3 is increased by the first shunt resonator Sh1, such that a bandwidth of the filter F3 is decreased. In the second mode Mode 2, the lower limit frequency of the filter F3 is decreased by the second shunt resonator Sh2, such that the bandwidth of the filter F3 is increased.

Figure 11A:
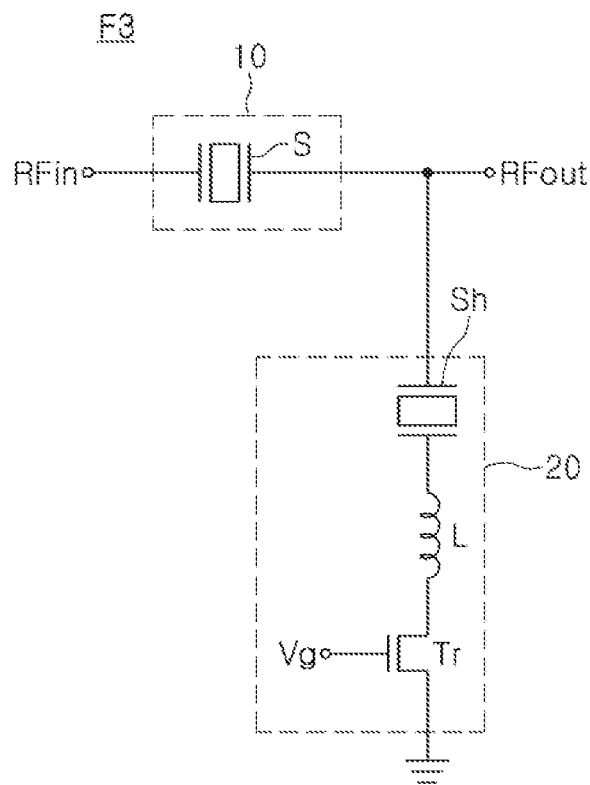
FIGS. 11A and 11B illustrate another example a manner of changing a lower limit frequency of FIG. 3.
Figure 11B:
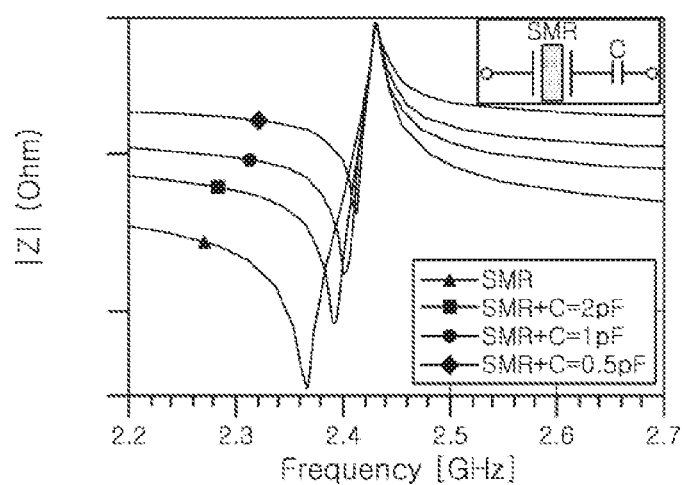

FIGS. 11A and 11B illustrate another example of a manner of changing a lower limit frequency of FIG. 3.

FIG. 11A is a circuit diagram illustrating the filter F3 according to another example in the present disclosure. FIG. 11B illustrate graphs of a change in the frequency band of the filter F3.

The filter F3 includes a plurality of resonators. Here, each of the plurality of resonators may include a film bulk acoustic resonator (FBAR).

The filter F3 includes at least one series unit 10 and at least one shunt unit 20 disposed between at least one series unit 10 and a ground. The filter F3 is formed in a ladder type filter structure as illustrated in FIG. 11A, or may be formed in a lattice type filter structure.

At least one series unit 10 is disposed between a signal input terminal RFin, to which an input signal is input, and a signal output terminal RFout, from which an output signal is output. At least one shunt unit 20 is disposed between a connection node between at least one series unit 10 and the signal output terminal RFout and a ground or between a connection node between at least one series unit 10 and the signal input terminal RFin and a ground.

A case in which the filter F3 includes one series unit 10 and one shunt unit 20 is illustrated in FIG. 11A, but a plurality of series units 10 and shunt units 20 may also be used. When the filter F3 includes a plurality of series units 10 and a plurality of shunt units 20, the plurality of series units 10 is connected to each other in series, and the plurality of shunt units 20 is disposed between a node between the series units 10 connected to each other in series and the ground. The series unit 10 includes at least one series resonator S.

The shunt unit 20 includes a shunt resonator Sh and a transistor Tr disposed between the shunt resonator Sh and a ground, and further includes a trimming inductor L disposed between the shunt resonator Sh and the transistor Tr.

The transistor Tr may be implemented by at least one of an N-channel field effect transistor and a P-channel field effect transistor. The transistor Tr may be turned on or turned off by a gate voltage Vg applied to a gate thereof. In detail, the transistor Tr is turned off in the first mode Mode 1, and turned on in the second mode Mode 2. The transistor Tr is equivalent to a resistor in a turned-on state, and equivalent to a capacitor in a turned-off state.

An anti-resonant frequency of the shunt unit 20 is changed depending on turning-on and turning-off operations of the transistor Tr. Referring to FIG. 11B, when the transistor Tr is turned off in the first mode Mode 1, the entire capacitance of the shunt unit 20 is decreased depending on the capacitance of the transistor Tr, such that the anti-resonant frequency of the shunt unit 20 is increased. In addition, when the transistor Tr is turned on in the second mode Mode 2, the entire capacitance of the shunt unit 20 is increased, such that the anti-resonant frequency of the shunt unit 20 is decreased.

Therefore, when the transistor Tr is turned off in the first mode Mode1, a lower limit frequency of the filter F3 is increased, such that a bandwidth of the filter F3 is decreased. When the transistor Tr is turned on in the second mode Mode 2, the lower limit frequency of the filter F3 is decreased, such that the bandwidth of the filter F3 is increased.

Figure 12A:
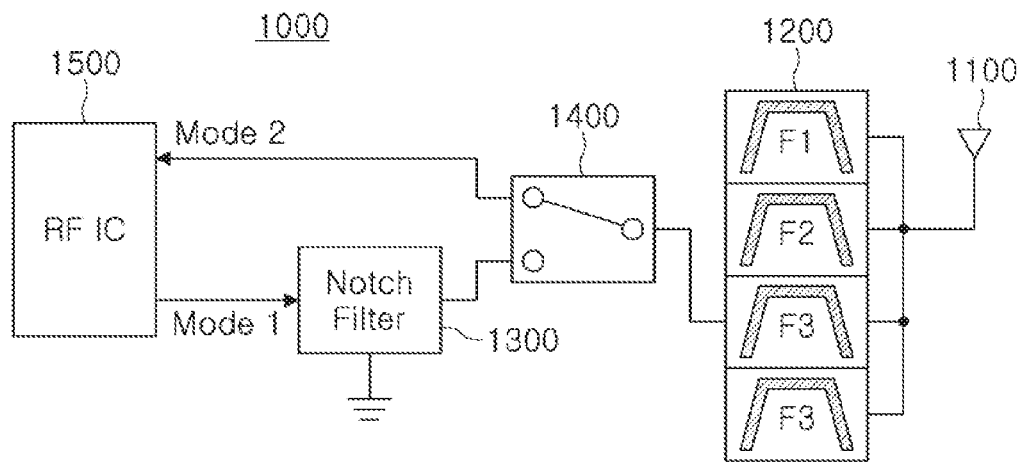
FIGS. 12A and 12B illustrate another example of a manner of changing a lower limit frequency according to another example of FIG. 3.
Figure 12B:
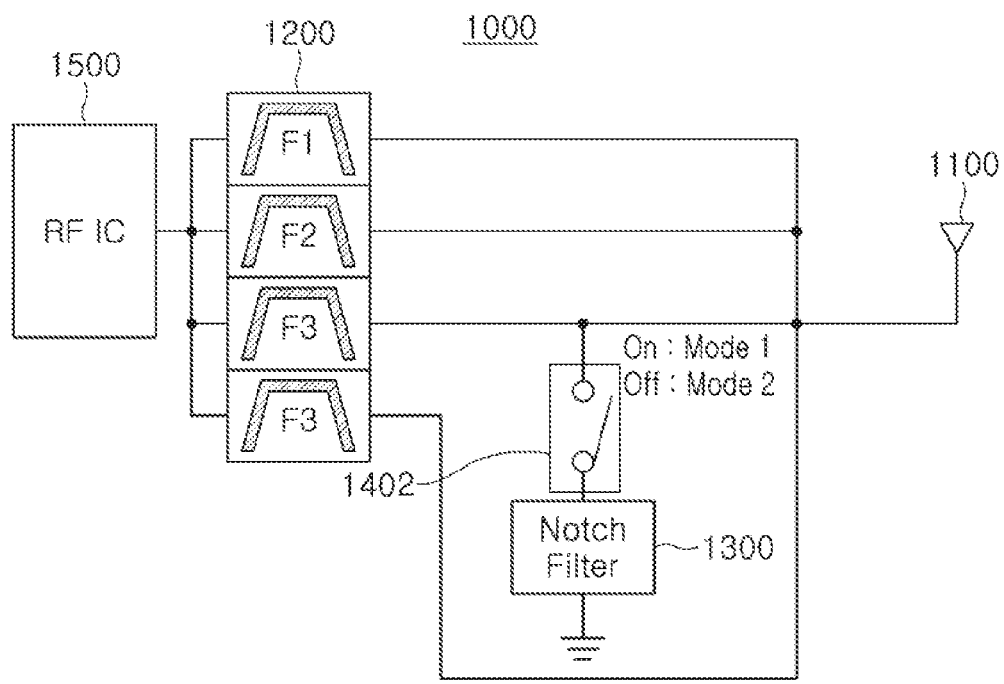

FIGS. 12A and 12B illustrate another example of a manner of changing a lower limit frequency of FIG. 3.

FIGS. 12A and 12B are circuit diagrams illustrating a front end module according to the present example.

Referring to FIGS. 12A and 12B, the front end module 1000 includes an antenna 1100, a filter module 1200, a notch filter 1300, a switch 1400, and a radio frequency (RF) integrated circuit (IC) 1500. A plurality of filters F1, F2, F3, and F4 of the filter module 1200 corresponds to those of the filter module of FIG. 3. The plurality of filters F1, F2, F3, and F4 of the filter module 1200 and the notch filter 1300 may be manufactured using film bulk acoustic resonators (FBARs). In this case, the notch filter 1300 and the switch 1400 disposed between the filter module 1200 and the notch filter 1300 may be manufactured as a single chip.

The antenna 1100 transmits and receives RF signals, and the filter module 1200 performs a filtering operation for passing and removing components in a specific frequency band in the RF signals received through the antenna 1100 or RF signals transmitted and received through the RF IC 1500. The filter module 1200 corresponds to the filter module of FIG. 3, and includes the plurality of filters F1, F2, F3, and F4.

The filter F3 of the filter module 1200 is selectively connected to the notch filter 1300 on a mode. The notch filter 1300 is selectively operated and connected between a signal path of the filter F3 and a ground. The notch filter 1300 is disposed between the filter module 1200 and the RF IC 1500 or may be disposed between the filter module 1200 and the antenna 1100, and may be selectively connected to the filter F3 depending on a mode.

Referring to FIG. 12A, the notch filter 1300 and the switch 1400 are disposed between the filter module 1200 and the RF IC 1500. Here, the notch filter 1300 is connected to the ground, such that a ground potential may be provided to the notch filter 1300. The switch 1400 is a three-terminal switch of which a first terminal is connected to the filter module 1200, a second terminal is connected to the RF IC 1500, and a third terminal is connected to the notch filter 1300. The first terminal of the switch 1400 connects the filter module 1200 to either the second terminal or the third terminal of the switch 1400. The first terminal of the switch 1400 connects to the RF IC 1500 and the second terminal of the switch 1400 connects through the notch filter 1300 to the RF IC 1500.

The switch 1400 directly connects the filter F3 of the filter module 1200 and the RF IC 1500 to each other in the second mode, and connects the filter F3 of the filter module 1200 and the RF IC 1500 to each other through the notch filter 1300 in the first mode.

Referring to FIG. 12B, the notch filter 1300 and a switch 1402 are disposed between the filter module 1200 and the antenna 1100. The switch 1402 is connected to a connection node between the filter F3 of the filter module 1200 and the antenna 1100, and the notch filter 1300 is disposed between the switch 1402 and a ground.

The switch 1402 is turned on in the first mode to connect the connection node between the filter F3 of the filter module 1200 and the antenna 1100 to the notch filter 1300, and is turned off in the second mode, such that only the antenna 1100 and the filter F3 are directly connected to each other.

Referring to FIGS. 12A and 12B, when a path of RF signals through the notch filter 1300, depending on a switching operation of the switch 1400 in the second mode, is not formed, a frequency band is formed depending on an upper limit frequency and a lower limit frequency of the filter F3. However, when a path of RF signals through the notch filter 1300 based on a switching operation of the switch 1400 in the first mode is formed, a lower limit frequency of the filter F3 is increased by frequency characteristics of the notch filter 1300, such that a bandwidth of the filter F3 is decreased.

Figure 13:
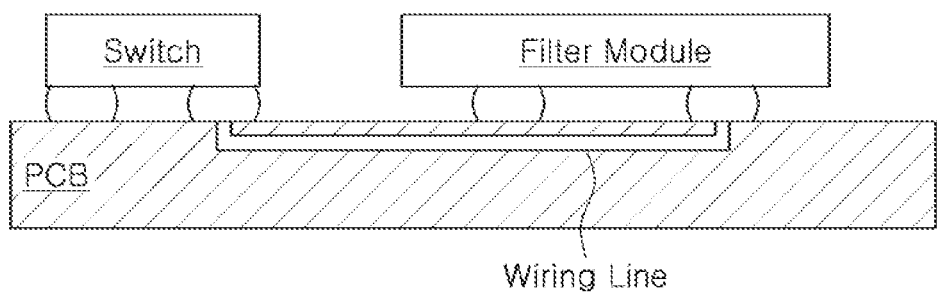
FIG. 13 is a schematic view illustrating an example of a manner of connecting a filter module and a switch to each other.

FIG. 13 is a schematic view illustrating an example of a manner of connecting a filter module and a switch to each other.

As described above, the filter module and the front end module include at least one switch and a transistor. However, as illustrated in FIG. 13, when the filter module and the switch are mounted on a printed circuit board PCB and are connected to each other through a wiring line provided in the printed circuit board PCB, signal loss is generated due to a parasitic component generated of the wiring line. Miniaturization of the front end module is also limited due to the area occupied by the switch on the printed circuit board PCB.

In the filter module and the front end module according to an example in the present disclosure, the filter module and the switch are integrated, such that the wiring line between the filter module and the switch is significantly decreased. Therefore, the signal loss generated due to the parasitic component of the wiring line is reduced. The area occupied by the switch on the printed circuit board PCB is also no longer needed, which promotes miniaturization of the front end module.

Figure 14:
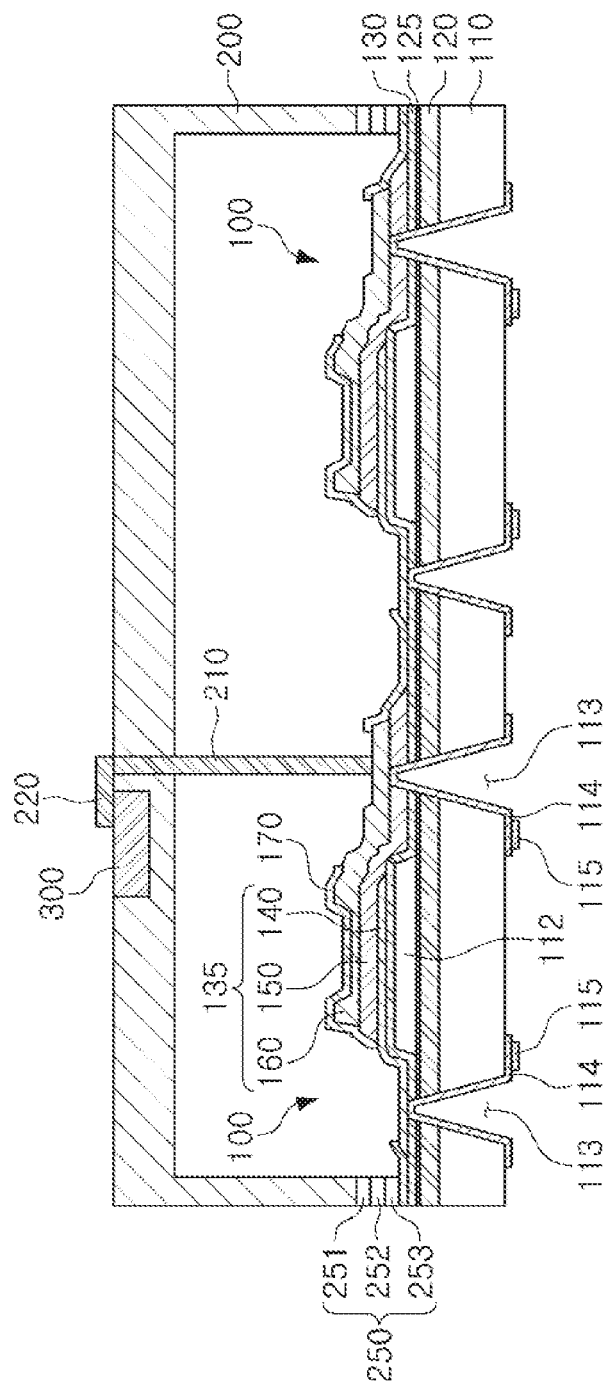
FIG. 14 is a cross-sectional view illustrating the filter module according to an example in the present disclosure.

FIG. 14 is a cross-sectional view illustrating a filter module according to an example in the present disclosure.

Referring to FIG. 14, the filter module according to an example in the present disclosure includes a plurality of bulk acoustic resonators 100 and a cap 200. The bulk acoustic resonator 100 may be a film bulk acoustic resonator (FBAR).

The bulk acoustic resonator 100 is implemented by a multilayer structure that includes a plurality of films. A case in which two bulk acoustic resonators 100 are implemented using the multilayer structure is illustrated in FIG. 14. Based on design, three or more bulk acoustic resonators 100 may be implemented by the multilayer structure. Adjacent bulk acoustic resonators 100 may be electrically connected to each other by a wiring electrode. As an example, the wiring electrode connects first electrodes 140 of the adjacent bulk acoustic resonators 100 to each other, and connect second electrodes 160 of the adjacent bulk acoustic resonators 100 to each other.

The bulk acoustic resonator 100 includes a substrate 110, an insulating layer 120, an air cavity 112, and a resonant part 135.

The substrate 110 may be a silicon substrate. The insulating layer 120 electrically isolating the resonant part 135 from the substrate 110 is provided on an upper surface of the substrate 110. The insulating layer 120 is formed on the substrate 110 by performing chemical vapor deposition, radio frequency (RF) magnetron sputtering, or evaporation using one of a silicon dioxide (SiO2) and an aluminum oxide (Al2O3).

The air cavity 112 is formed on the insulating layer 120. The air cavity 112 is positioned below the resonant part 135 so that the resonant part 135 vibrates in a predetermined direction. The air cavity 112 is formed by a process of forming a sacrificial layer pattern on the insulating layer 120, forming a membrane 130 on the sacrificial layer pattern, and then etching and removing the sacrificial layer pattern. The membrane 130 serves as the oxidation protecting film, or may serve as the protective layer protecting the substrate 110.

An etch stop layer 125 is additionally formed between the insulating layer 120 and the air cavity 112. The etch stop layer 125 serves to protect the substrate 110 and the insulating layer 120 from an etching process, and serves as a base required for depositing several different layers on the etch stop layer 125.

The resonant part 135 includes the first electrode 140, a piezoelectric layer 150, and the second electrode 160 sequentially stacked on the membrane 130. A common region in which the first electrode 140, the piezoelectric layer 150, and the second electrode 160 overlap one another in a vertical direction may be positioned above the air cavity 112. The first electrode 140 and the second electrode 160 may be formed of one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof.

The piezoelectric layer 150, which generates a piezoelectric effect that electrical energy is converted into mechanical energy having an elastic waveform, may be formed of one of an aluminum nitride (AlN), a zinc oxide (ZnO), and a lead zirconate titanate oxide (PZT; PbZrTiO). In addition, the piezoelectric layer 150 may further include a rare earth metal. As an example, the rare earth metal may include at least one of scandium (Sc), erbium (Er), yttrium (Y), and lanthanum (La).

A seed layer for improving crystal alignment of the piezoelectric layer 150 is additionally disposed below the first electrode 140. The seed layer may be formed of one of an aluminum nitride (AlN), a zinc oxide (ZnO), and a lead zirconate titanate oxide (PZT; PbZrTiO) having the same crystallinity as that of the piezoelectric layer 150.

The resonant part 135 may be divided into an active region and an inactive region. The active region of the resonant part 135, a region vibrating and resonating in a predetermined direction by a piezoelectric phenomenon generated in the piezoelectric layer 150 when electrical energy such as a radio frequency signal is applied to the first electrode 140 and the second electrode 160, corresponds to a region in which the first electrode 140, the piezoelectric layer 150, and the second electrode 160 overlap one another in the vertical direction above the air cavity 112. The inactive region of the resonant part 135, a region that does not resonate by the piezoelectric phenomenon even through the electrical energy is applied to the first and second electrodes 140 and 160, corresponds to a region outside the active region.

The resonant part 135 may output a radio frequency signal having a specific frequency using the piezoelectric phenomenon. In detail, the resonant part 135 may output a radio frequency signal having a resonant frequency corresponding to vibrations depending on the piezoelectric phenomenon of the piezoelectric layer 150.

A protective layer 170 is disposed on the second electrode 160 of the resonant part 135 to prevent the second electrode 160 from being externally exposed. The protective layer 170 may be formed of one of a silicon oxide based insulating material, a silicon nitride based insulating material, and an aluminum nitride based insulating material.

At least one via hole 113 penetrating through the substrate 110 in a thickness direction is formed in a lower surface of the substrate 110. The via hole 113 penetrates through portions of the insulating layer 120, the etch stop layer 125, and the membrane 130 in the thickness direction, in addition to the substrate 110. A connection pattern 114 is formed in the via hole 113, and may be formed over the entirety of an inner surface, that is, an inner wall, of the via hole 113.

The connection pattern 114 may be manufactured by forming a conductive layer on the inner surface of the via hole 113. As an example, the connection pattern 114 is formed by depositing, applying, or filling at least one conductive metal of gold (Au), copper (Cu), and a titanium (Ti)-copper (Cu) alloy along the inner wall of the via hole 113.

The connection pattern 114 is connected to at least one of the first electrode 140 and the second electrode 160. As an example, the connection pattern 114 penetrates through at least portions of the substrate 110, the membrane 130, the first electrode 140, and the piezoelectric layer 150, and be then electrically connected to at least one of the first electrode 140 and the second electrode 160. The connection pattern 114 formed on the inner surface of the via hole 113 is extended to the lower surface of the substrate 110 to be thus connected to a connection pad 115 provided on the lower surface of the substrate 110. Therefore, the connection pattern 114 electrically connects the first electrode 140 and the second electrode 160 to the connection pad 115. As an example, the connection pad 115 includes copper (Cu).

The connection pad 115 may be electrically connected to a main board that may be disposed below the filter through a bump. The bulk acoustic resonator 100 performs a filtering operation of a radio frequency signal by a signal applied from the main board to the first and second electrodes 140 and 160 through the connection pad 115. The filter connected to the main board may form a filter module.

The cap 200 is bonded to the multilayer structure forming the plurality of bulk acoustic resonators 100 to protect the plurality of bulk acoustic resonators 100 from an external environment. The cap 200 may be packaged together with the multilayer structure in a wafer level.

The cap 200 forms a cover including an internal space in which the plurality of bulk acoustic resonators 100 are accommodated. The cap 200 may have a hexahedral shape in which a lower surface thereof is opened, and thus have an upper surface and a plurality of side surfaces.

In detail, the cap 200 may have an accommodating part formed at the center thereof to accommodate the resonant parts 135 of the plurality of bulk acoustic resonators 100 therein, and an edge of the cap 200 may be stepped as compared to the accommodating part so that the cap 200 may be bonded to a bonded region of the multilayer structure. The bonded region of the multilayer structure may correspond to an edge of the multilayer structure.

A case in which the cap 200 is bonded to the protective layer 170 stacked on the substrate 110 is illustrated in FIG. 14, but the cap 200 may be bonded to at least one of the membrane 130, the etch stop layer 125, the insulating layer 120, and the substrate 110, in addition to the protective layer 170.

The cap 200 may be bonded to the multilayer structure by eutectic bonding. After an adhesive 250 that may be eutectically bonded is deposited on the multilayer structure, the multilayer structure and the cap 200 may be pressed and heated to be thus bonded to each other.

The adhesive 250 includes at least one adhesive layer to eutectically bond the multilayer structure and the cap 200 to each other. The adhesive 250 is provided in a bonded region between the multilayer structure and the cap 200.

The adhesive 250 includes at least three adhesive layers sequentially stacked between the multilayer structure and the cap 200. As an example, the adhesive 250 includes a first adhesive layer 251, a second adhesive layer 252, and a third adhesive layer 253. The first adhesive layer 251 may include one of gold (Au), copper (Cu), silver (Ag), platinum (Pt), nickel (Ni), and palladium (Pd), the second adhesive layer 252 may include tin (Sn), and the third adhesive layer 253 may include one of gold (Au), copper (Cu), silver (Ag), platinum (Pt), nickel (Ni), and palladium (Pd). The first adhesive layer 251 and the third adhesive layer 253 may be formed of the same material to enable the eutectic bonding together with the second adhesive layer 252.

At least one switch 300 is provided on an upper surface of the cap 200. The switch 300 of FIG. 14 corresponds to the switches illustrated in FIGS. 8A, 9A and 9B, 10A, and 12A and 12B, and the transistor illustrated in FIG. 11A. The switch 300 is formed on the upper surface of the cap 200 by a complementary metal oxide semiconductor (CMOS) process. The switch 300 is formed on the cap 200 before or after the cap 200 and the multilayer structure are bonded to each other.

A connection electrode 210 and a cap connection pad 220 for providing an electrical connection path of the switch 300 is formed in the cap 200. The cap 200 includes at least one connection electrode 210, which penetrates through the upper surface of the cap 200 in the thickness direction, and is substantially vertically formed.

The cap connection pad 220 may be provided along the upper surface of the cap 200 and be connected to the switch 300 exposed to the upper surface of the cap 200, and at least one connection electrode 210 may be connected to the switch 300 through the cap connection pad 220 extended along the upper surface of the cap 200.

At least one connection electrode 210 is extended to the upper surface of the cap 200 and connected to at least one of the first electrode 140 and the second electrode 160. A case in which the connection electrode 210 is connected to the first electrode 140 and the second electrode 160 is illustrated in FIG. 14, but the connection electrode 210 may penetrate through the first electrode 140 and the second electrode 160 and be then connected directly to the connection pattern 114 electrically connected to the first electrode 140 and the second electrode 160.

A switching operation of the switch 300 is controlled by a signal applied from the main board disposed below the filter to the switch 300 through the connection pattern 114 and the connection pad 115.

According to an example in the present disclosure, the switch 300 may be operated by a control of the main board disposed below the filter in a state in which it is adjacent to the filter, and formation of a complicate circuit pattern provided at a large length on the main board in order to connect the switch and the filter module to each other in the related art may be thus avoided, resulting in reducing the signal loss generated due to the parasitic component and increasing efficiency of an area of the board in which components are mounted.

As set forth above, the filter module according to an example in the present disclosure may include a plurality of filters, and at least one filter may control bands having overlapping bandwidths, such that a size and manufacturing costs of the filter module may be decreased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
a series unit; and
a shunt unit disposed between the series unit and a ground, the shunt unit comprising a first shunt resonator and a second shunt resonator selectively operated to narrow or widen a frequency band of the filter based on a selected one of the first shunt resonator or the second shunt resonator, and each of the first shunt resonator and the second shunt resonator comprising a film bulk acoustic resonator.

2. The filter of claim 1, wherein the first shunt resonator and the second shunt resonator have different anti-resonant frequencies each from the other.

3. The filter of claim 2, wherein the frequency band of the filter is varied based on a selective operation of the first shunt resonator and the second shunt resonator.

4. The filter of claim 3, wherein a lower limit frequency of the frequency band is varied based on the selective operation of the first shunt resonator and the second shunt resonator.

5. The filter of claim 2, wherein the first shunt resonator and the second shunt resonator are connected to each other in parallel.

6. The filter of claim 5, wherein the shunt unit further comprises:
a first switch connected to the first shunt resonator in series; and
a second switch connected to the second shunt resonator in series.

7. The filter of claim 6, wherein the first shunt resonator, the second shunt resonator, the first switch, and the second switch are formed in a single chip.

8. The filter of claim 6, wherein the first shunt resonator and the second shunt resonator are selectively operated based on switching operations of the first switch and the second switch.

9. The filter of claim 1, wherein, in one selectively operated state, the frequency band of the first shunt resonator is narrower than that of the second shunt resonator.

10. The filter of claim 1, wherein an anti-resonant frequency of the first shunt resonator is higher than that of the second shunt resonator, and in one selectively operated state, the frequency band of the first shunt resonator is narrower than that of the second shunt resonator.

11. The filter of claim 1, wherein the first shunt resonator and the second shunt resonator have different frequency bands from each other.

12. A filter, comprising:
a series unit; and
a shunt unit disposed between the series unit and a ground, the shunt unit comprising a shunt resonator and a transistor disposed between the shunt resonator and the ground,
wherein a frequency band of the filter is varied to narrow or widen the frequency band based on turning-on and turning-off operations of the transistor.

13. The filter of claim 12, wherein in a turned-on operating state, the transistor is equivalent to a resistor, and in a turned-off operating state, the transistor is equivalent to a capacitor.

14. The filter of claim 13, wherein an anti-resonant frequency of the shunt unit is varied based on the turning-on and turning-off operations of the transistor.

15. The filter of claim 14, wherein a lower limit frequency of the frequency band is varied based on the variation in the anti-resonant frequency of the shunt unit.

16. The filter of claim 15, wherein the anti-resonant frequency of the shunt unit during the turning-off operation of the transistor is higher than that of the shunt unit during the turning-on operation of the transistor.

17. The filter of claim 16, wherein the frequency band during the turning-off operation of the transistor is narrower than that during the turning-on operation of the transistor.

18. The filter of claim 12, wherein the frequency band during the turning-off operation of the transistor is narrower than that during the turning-on operation of the transistor.

19. The filter of claim 12, wherein the frequency band during the turning-off operation of the transistor is different than that during the turning-on operation of the transistor.

20. A filter, comprising:
a series unit; and
a shunt unit disposed between the series unit and a ground, the shunt unit comprising a first shunt resonator and a second shunt resonator that are selectively operated, each of the first shunt resonator and the second shunt resonator comprising a film bulk acoustic resonator, the first shunt resonator and the second shunt resonator having different anti-resonant frequencies each from the other,
wherein a frequency band of the filter is varied based on a selective operation of the first shunt resonator and the second shunt resonator, and
wherein an anti-resonant frequency of the first shunt resonator is higher than that of the second shunt resonator, and in one selectively operated state, the frequency band of the first shunt resonator is narrower than that of the second shunt resonator.

* * * * *